US011302407B2

(12) United States Patent
McVay et al.

(10) Patent No.: US 11,302,407 B2
(45) Date of Patent: *Apr. 12, 2022

(54) MEMORY PROXIMITY DISTURB MANAGEMENT

(71) Applicant: Micron Technology, Inc., Boise, ID (US)

(72) Inventors: Jeffrey L. McVay, El Dorado Hills, CA (US); Samuel E. Bradshaw, Sacramento, CA (US); Justin Eno, El Dorado Hills, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/202,205

(22) Filed: Mar. 15, 2021

(65) Prior Publication Data

US 2021/0202021 A1 Jul. 1, 2021

Related U.S. Application Data

(63) Continuation of application No. 16/442,430, filed on Jun. 14, 2019, now Pat. No. 10,950,318.

(51) Int. Cl.
| | |
|---|---|
| *G11C 16/34* | (2006.01) |
| *G11C 29/52* | (2006.01) |
| *G11C 16/10* | (2006.01) |
| *G11C 16/30* | (2006.01) |
| *G11C 16/26* | (2006.01) |
| *G11C 16/04* | (2006.01) |

(52) U.S. Cl.
CPC .......... *G11C 16/3431* (2013.01); *G11C 16/10* (2013.01); *G11C 16/26* (2013.01); *G11C 16/30* (2013.01); *G11C 29/52* (2013.01); *G11C 16/0483* (2013.01)

(58) Field of Classification Search
CPC ..... G11C 16/10; G11C 16/3431; G11C 16/26; G11C 16/30; G11C 16/0483; G11C 29/52
See application file for complete search history.

(56) References Cited

U.S. PATENT DOCUMENTS

| 2013/0304982 A1 | 11/2013 | Jung et al. |
| 2015/0378841 A1 | 12/2015 | Jayakumar et al. |

OTHER PUBLICATIONS

Micron Technology, Inc., "Technical Note: Design and Use Considerations for NAND Flash Memory", TN-29-17: NAND Flash Design and Use Considerations, 2006, pp. 1-8.
Non-Final Office Action, U.S. Appl. No. 16/442,430, dated Aug. 3. 2020, 11 pages.
Notice of Allowability, U.S. Appl. No. 16/442,430, dated Nov. 16, 2020, 8 pages.

*Primary Examiner* — David Yi
*Assistant Examiner* — Nicholas A. Paperno
(74) *Attorney, Agent, or Firm* — Nicholson De Vos Webster & Elliott LLP (57) ABSTRACT

Exemplary methods, apparatuses, and systems include a controller to manage memory proximity disturb. The controller identifies a first memory location in response to an access of a second memory location, the first memory location storing a first value. The controller updates a first disturb value by a first amount, the first disturb value representing a cumulative disturb effect on the first value in the first memory location by accesses to a first plurality of memory locations proximate to the first memory location, the first plurality of memory locations including the second memory location.

20 Claims, 4 Drawing Sheets

MEMORY PROXIMITY DISTURB MANAGEMENT

CROSS-REFERENCE TO RELATED APPLICATIONS

This application is a continuation of U.S. patent application Ser. No. 16/442,430, filed Jun. 14, 2019, which is hereby incorporated by reference.

TECHNICAL FIELD

The present disclosure generally relates to memory, and more specifically, relates to managing proximity disturb in memory.

BACKGROUND ART

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory subsystem to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to managing proximity disturb in a memory subsystem. A memory subsystem is also hereinafter referred to as a "memory device." An example of a memory subsystem is a memory module that is connected to a central processing unit (CPU) via a memory bus. Examples of memory modules include a dual in-line memory module (DIMM), a small outline DIMM (SO-DIMM), a non-volatile dual in-line memory module (NVDIMM), etc. Another example of a memory subsystem is a storage device that is connected to the central processing unit (CPU) via a peripheral interconnect (e.g., an input/output bus, a storage area network, etc.). Examples of storage devices include a solid-state drive (SSD), a flash drive, a universal serial bus (USB) flash drive, and a hard disk drive (HDD). In some embodiments, the memory subsystem is a hybrid memory/storage subsystem. In general, a host system can utilize a memory subsystem that includes one or more memory components. The host system can provide data to be stored at the memory subsystem and can request data to be retrieved from the memory subsystem.

As semiconductor manufacturing techniques pack memory cells that store data closer and closer together to achieve smaller and/or higher capacity memory products, memory cells have reduced isolation from each other. The reduced isolation increases certain effects. One such effect is disturbance coupling, also referred to as proximity disturb, where accessing one cell (an aggressor) causes artifacts associated with that access to disturb nearby cells (victims). For media that use an electric or magnetic process to program the state of a memory cell, such as disk drives or flash media, magnetic and/or electric effects propagate to surrounding memory cells. For media that use a thermal process to program the state of a memory cell, such as phase change media, thermal effects propagate to neighboring memory cells. As the density of the memory cells that store data increases, proximity disturb can cause an access to one memory cell to disturb the data stored in nearby memory cells due to the reduced distance (and therefore isolation) between memory cells. Failure to remediate the effects of proximity disturb can result in data loss; unconstrained accesses to cells will eventually toggle the binary states in the neighboring cells that are victims of such accesses.

Aspects of the present disclosure address the above and other deficiencies by managing proximity disturb. According to some embodiments, the memory subsystem maintains a value representing a cumulative disturbance of one or more victim memory cells. The magnitude of the individual disturbance of each aggressor-victim operation can be a function of the relative location of aggressor cell(s) to the victim and/or of the type of operation performed on the aggressor cell(s). The cumulative disturbance reflects the total expected disturbance of the victim as operations to proximate aggressors occur over time. One management technique involves tracking the accumulated disturb with a value (e.g., stored with a counter), where the memory subsystem updates the values associated with one or more victim cells based on the nature of each individual aggression. Once the value reaches a threshold (e.g., a ceiling or a floor) associated with a potential for data loss, the memory subsystem refreshes the data in the associated memory cell(s) by reading the data and writing it back to the memory cell(s). The refresh operation nullifies the accumulated disturb effects, bringing the cell back to a "pristine" state.

Figure 1:
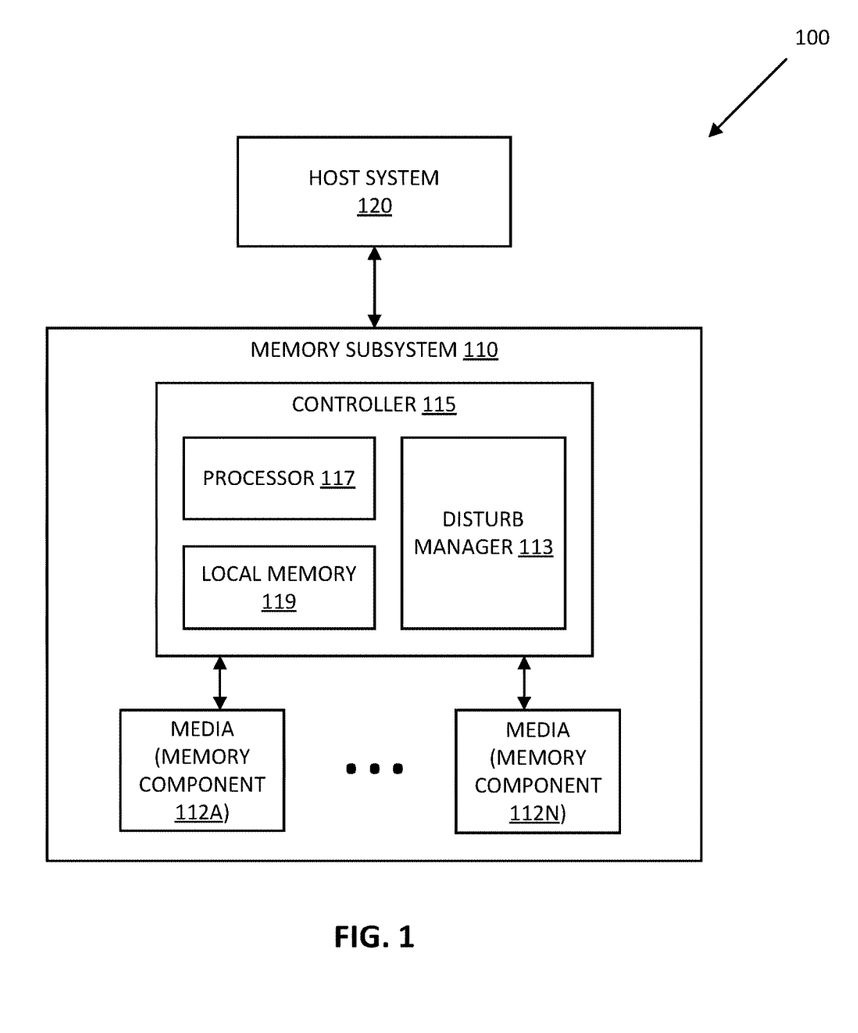
FIG. 1 illustrates an example computing environment that includes a memory subsystem in accordance with some embodiments of the present disclosure.

FIG. 1 illustrates an example computing environment 100 that includes a memory subsystem 110 in accordance with some embodiments of the present disclosure. The memory subsystem 110 can include media, such as memory components 112A to 112N. The memory components 112A to 112N can be volatile memory components, non-volatile memory components, or a combination of such. In some embodiments, the memory subsystem is a storage system. An example of a storage system is an SSD. In some embodiments, the memory subsystem 110 is a hybrid memory/storage subsystem. In general, the computing environment 100 can include a host system 120 that uses the memory subsystem 110. For example, the host system 120 can write data to the memory subsystem 110 and read data from the memory subsystem 110.

The host system 120 can be a computing device such as a desktop computer, laptop computer, network server, mobile device, or such computing device that includes a memory and a processing device. The host system 120 can include or be coupled to the memory subsystem 110 so that the host system 120 can read data from or write data to the memory subsystem 110. The host system 120 can be coupled to the memory subsystem 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory subsystem 110. The host system 120 can further utilize an NVM Express (NVMe) interface to access the memory components 112A to 112N when the memory subsystem 110 is coupled with the host system 120 by the PCIe interface. The physical host interface can provide an interface for passing control, address, data, and other signals between the memory subsystem 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or another suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory subsystem 110, including handling communications between the memory subsystem 110 and the host system 120. In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the controller 115, in another embodiment of the present disclosure, a memory subsystem 110 may not include a controller 115, and may instead rely upon external control (e.g., provided by an external host, or by a processor or controller separate from the memory subsystem).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the controller 115 and decode the address to access the memory components 112A to 112N.

The memory subsystem 110 includes a disturb manager 113 that can track cumulative disturbance to memory cells and initiate remediation before the disturbance results in data loss. In some embodiments, the controller 115 includes at least a portion of the disturb manager 113. For example, the controller 115 can include a processor 117 (processing device) configured to execute instructions stored in local memory 119 for performing the operations described herein. In some embodiments, the disturb manager 113 is part of the host system 110, an application, or an operating system.

To track cumulative disturbance, the disturb manager 113 can maintain, for each potential victim, a value representing the cumulative disturb on the victim in the local memory 119. Victims can represent one or more cells that are read and written as a group. Such groups may be logically referred to as a sector, page, location, or other term. The value can be a counter that is incremented when an aggressor disturbs the associated victim. Different operation types on an aggressor can inflict different levels of disturbance on surrounding victims. For example, a write operation to an aggressor might cause 10 times (10×) the disturb to neighboring victims than a read operation to the same aggressor. Furthermore, different environmental conditions can impact the magnitude of the disturbance effect of an operation. For example, if increases in ambient temperature magnify the disturbance effect of operations, the disturb manager 113 can adjust the magnitude of the counter increment based on the ambient temperature to capture this phenomenon.

To detect aggressions, the disturb manager 113 monitors the address and type of operations directed to the media 112, such as read, write, and/or erase operations. Operation monitoring can be performed in a number of ways. In some embodiments, the processor 117 or other component of the controller 115 sends a message to the disturb manager 113 any time a new media operation is initiated. In some embodiments, the disturb manager 113 can monitor per-operation metadata either as the metadata is stored in memory (e.g., in an operations buffer or queue) or as the metadata is passed on a communications interconnect between other components of the controller 115.

Based on the address of the operation, the disturb manager 113 can identify any victims associated with the operation. The disturb manager 113 can then initiate one or more read operation to fetch the disturb values associated with the victims from the local memory 119. The disturb manager 113 can update the fetched disturb values based on one or more factors, such as the type of operation carried out on the aggressor, the proximity of each victim to the aggressor, the orientation of the victim to the aggressor, etc. In some memory subsystems, operations on an aggressor can impact the disturb value associated with the aggressor. For example, a read may slightly disturb the aggressor's contents while a write may reset its accumulated disturb. In such cases, the disturb manager 113 can also read the disturb value associated with the aggressor from the local memory 119 to update the value.

Additional details related to victim identification and disturb value update are provided below with reference to FIG. 2.

To remediate accumulated disturbance effects on a cell or group of cells that are read or written as a group, the disturb manager 113 checks the updated disturb values against a disturb threshold. The disturb threshold can be determined empirically based on the number of aggresses that can be absorbed by a memory cell before likely data loss. In one embodiment, the disturb threshold varies over the lifetime of the memory subsystem. The disturb threshold can be set during device manufacture. For example, a disturb threshold can be 1,000, where a read operation contributes '1' to the accumulated disturb and a write operation contributes '10' to the accumulated disturb. The disturb threshold can be set to provide significant margin before data loss is expected (e.g., a disturb threshold of 1,000 can be set based upon being 50% of a disturb value of 2,000 at which data loss is expected).

If any of the updated values satisfy the disturb threshold, the disturb manager 113 can initiate a corrective action on the associated data. In some embodiments, the initiated corrected action includes causing the controller 115 to read the data stored in the cells having an associated disturb value that satisfied the disturb threshold from the media 112 and writing that same data back to the cells. In this manner, the controller 115 resets the accumulated disturbance effect on the rewritten cells. Additionally, the disturb manager 113 can reset the disturb value associated with the cells in the local memory 119.

In some embodiments, the controller 115 can defer rewriting the data for remediation by performing a diagnostic read of the data in the victim cells. The data stored on the media 112 can be encoded to allow for error detection and correction (EDC). For example, the data stored on the media 112 can have a payload portion and a metadata portion, where the payload portion contains user or system data and the metadata portion contains, e.g., error correcting codes that protect the payload portion. The controller 115 can use the encoded EDC data to detect and correct up to a maximum raw bit-error rate (BER). The disturb manager 113 can initiate a diagnostic read of the data in the cells associated with the disturb value that exceeded the disturb threshold to obtain the raw BER of those cells and to buffer the unencoded (and corrected) data. The raw BER can be a function of the number of modifications to a payload portion of the data based on the metadata portion. If the raw BER exceeds a BER threshold, the disturb manager 113 can initiate a corresponding write of the buffered data to the media 112 to reset the accumulated disturbance effect on the cells. In some embodiments, the disturb manager 113 can initiate a raw rewrite of the bit-exact data as read from the media 112. That is, the data written to the media 112 is the same as the data as-read from the media 112, including both the payload (e.g., user data) and metadata (e.g., EDC data). While having minimal impact on other memory subsystem operations, the raw re-write can propagate errors such as stuck-at faults (e.g., where a cell is stuck at a '1' or a '0') or cells that had prematurely disturbed bits (e.g., due to accumulated aggressions). To minimize such error propagation, in some embodiments the disturb manager 113 can decode the data as-read from the media 112, thereby correcting any errors, and re-encode the payload before writing it back to the media 112. In some embodiments, the disturb manager 113 may elect whether to perform a raw rewrite of the data or to re-encode the data based on the amount by which the raw BER exceeds the BER threshold, for example.

Otherwise, if the BER dos not exceed the BER threshold, the disturb manager 113 can reduce the associated disturb value of the victim cells by a fixed amount or by an amount relative to the difference between the raw BER and the BER threshold. The disturb manager 113 can then write the reduced disturb value to the local memory 119 without a rewrite of the data to the media 112. By avoiding this rewrite of the data, the disturb manager 113 defers the disturbance of other neighboring cells of these victim cells who become victims of the rewrite operation in the media 112 and avoids interrupting other host-initiated data operations with the media 112.

In some embodiments, the memory subsystem persists the disturb values stored in the local memory 119 in a non-volatile memory device, such as the media 112, when power is removed and restores the persisted values stored in the non-volatile memory device to the local memory 119 when power is applied (e.g., when the local memory 119 is a volatile memory and the media 112 is a non-volatile memory). For example, the controller 115 can detect or receive a signal indicating the loss of power from a primary power source resulting in a finite period in which the memory subsystem 110 can continue to operate using a secondary power source. As another example, the controller 115 can receive an indication from the host system 120 of an imminent power shutdown or power cycling. In either case, the controller 115 can read the disturb values from the local memory 119 and write them to the non-volatile memory. Once the primary power source is restored, the controller 115 can read the disturb values from the non-volatile memory and write them to the local memory 119 during, for example, a series of controller operations that are performed during startup.

In some embodiments, the power available from the secondary power source can be reserved for other, higher-priority operations such that persisting the disturb values is not possible. In such cases, the disturb manager 113 can initialize the disturb values once the primary power source is restored. In some embodiments, the disturb manager 113 can initialize all the disturb values to the same value. In some embodiments, this initialized value is near the disturb threshold. For example, if the disturb threshold is 1,000, the disturb manager 113 can initialize all the disturb values to 990 following power application to the memory subsystem. Such an initialization of disturb values, however, could lead to the first operation to the media 112 causing a cascade of remediations at once (e.g., a write to one cell causes remediation of its neighbors, which cause remediation of their neighbors, and so on). To avoid such a cascade, the disturb manager 113 can randomly initialize the disturb values in a range up to the disturb threshold. For example, the disturb manager can randomly initialize the disturb values within 20% of the disturb threshold (e.g., between 800 and 1,000). As another example, the disturb manager can initialize the disturb values between 800 and 1,000 based on a pattern, such as one that attempts to maximize the on-die distance between the locations associated with the disturb values that are initialized to near the upper disturb values. The initialization values can be increased or decreased relative to the disturb threshold depending on the margin built into the disturb threshold. For example, if data loss is likely at 2,000 and the disturb threshold is 1,000, the initialization values can be further away from the disturb threshold than if data loss is likely at 1,100 and the disturb threshold is 1,000.

In some embodiments, the disturb manager 113 reads, updates, refreshes, and/or writes disturb value to the local memory 119 asynchronously relative to the underlying media operations. That is, the controller 115 can perform many operations on the media 112 without waiting for the associated disturb value updates by the disturb manager 113 to the local memory 119. The disturb manager 113 can maintain a set of operations to be carried out on disturb values in the local memory 119. The disturb manager 113 can intermittently dispatch operations in the set to the local memory 119.

Figure 2:
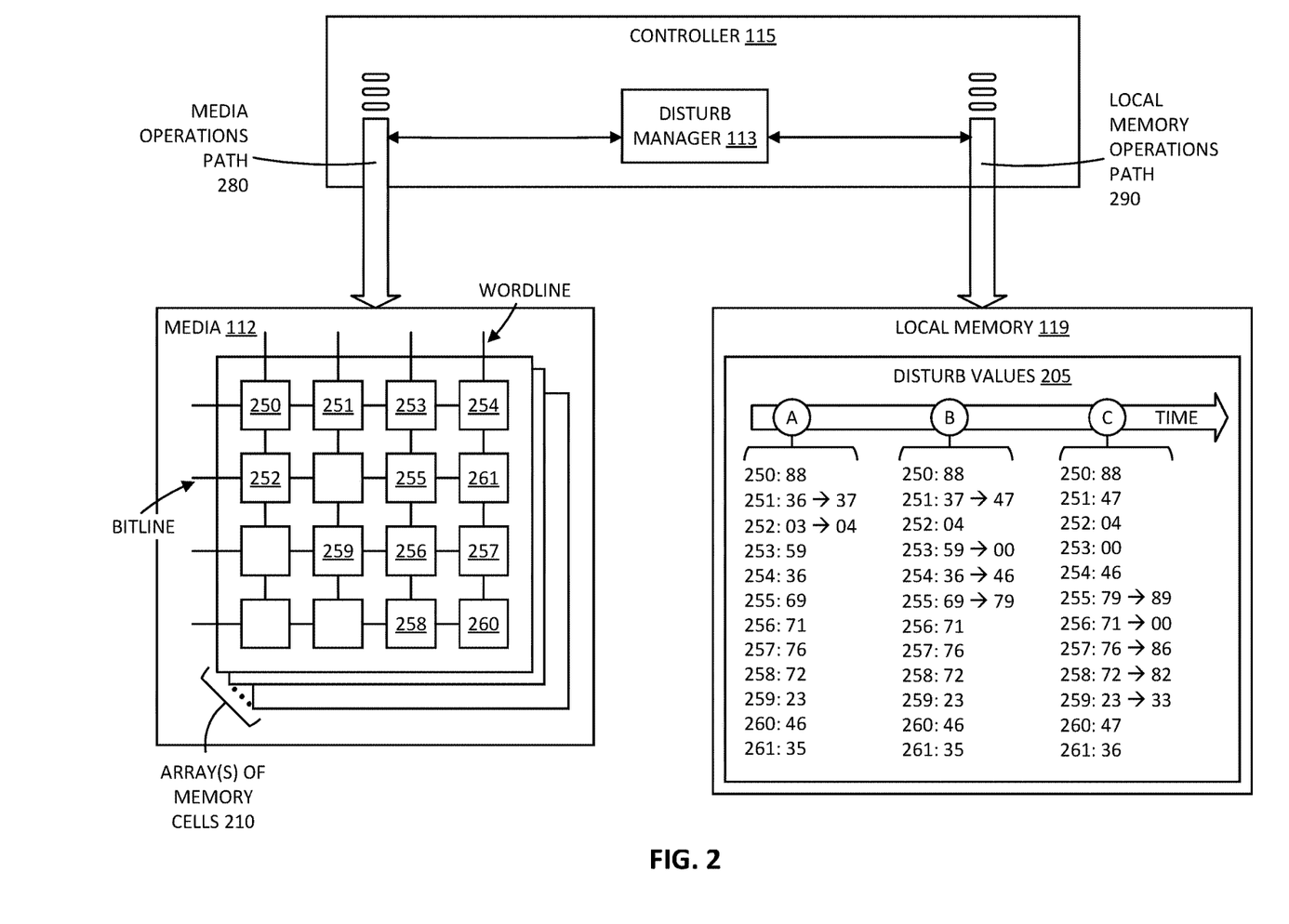
FIG. 2 illustrates an exemplary proximity disturb management technique based on an exemplary sequence of operations in accordance with some embodiments of the present disclosure.

FIG. 2 illustrates an exemplary proximity disturb management technique based on an exemplary sequence of operations in accordance with some embodiments of the present disclosure. As shown, one or more arrays of memory cells 210 form the media 112. In this simplified example, each array includes a 4×4 array of cells where each cell is located at the intersection of a bitline and a wordline. The shape and magnitude of the disturbance coupling from one cell to surrounding cells can differ for different manufacturing processes, media architectures, and operation types. With reference to the grid-like array 210, disturbance coupling may extend symmetrically or asymmetrically from the aggressor along a given dimension (e.g., along a wordline or bitline, to corresponding cells in other stacked arrays 210, etc.). The disturbance coupling can also be anisotropic, varying across dimensions. The nature of the operation can further change the magnitude or size of the disturbance coupling region. For example, if a write operation generates higher temperatures or a stronger electric or magnetic field than a read operation, the disturbed cells can be subject to fewer proximate write operations than read operations before remediation occurs. As another example, if a write operation generates temperature deltas over a larger area or a larger electric or magnetic field than a read operation, the write operation can disturb additional cells that are not disturbed during a read operation. In some embodiments, a write operation resets the cumulative disturbance level associated with a cell. In some embodiments, a read operation contributes to the cumulative disturb level of the location being read (i.e., the aggressor) as well as to neighboring locations.

In some embodiments, operations can be performed on groups of cells within an array 210 or that span multiple arrays, such as groups of two or more cells along a wordline or bitline on each of a group of arrays 210. For example, a 512 byte sector can be formed of two cells located at the same address on each of 2,048 arrays 210 and reads and writes occur at the sector level (e.g., 512 bytes at a time). In such a case, the disturb manager 113 maintains values representing the cumulative disturb of cells that are operated on as a group (e.g., one value per sector). Cells that are written to or read from as a group—whether a single cell or multiple cells—may be referred to as a memory location.

In the example described with reference to FIG. 2, the disturbance coupling extends to a single adjacent cell to the aggressor in each direction along a wordline and bitline, write operations reset the cumulative disturbance associated with the written (aggressor) cell, read operations do not disturb the read (aggressor) cell, and write operations inflict 10× the disturb of a read operation. The disturb manager 113 maintains values representing the cumulative disturb of each cell in the local memory 119.

The media operations can be initiated externally by a host system (e.g., the host system 120) or internally by the controller 115 (e.g., for garbage collection). Once the operation is initiated, the disturb manager 113 identifies the impacted cell(s) and updates the values representing the cumulative disturbance of those cells accordingly. Note that the update of the values in the local memory 119 can be asynchronous relative to the operations performed on the media 112. For example, the media operation can occur sometime before, during, or after the associated value update, depending on factors such as delays associated with operations, the number of enqueued operations to the media 112 and/or the local memory 119, etc.

The exemplary sequence of media operations illustrated in FIG. 2 is as follows: at time A, the controller 115 reads from the memory cell 250; at time B, the controller 115 writes to the memory cell 253; and, at time C, the controller 115 writes to the memory cell 256. Disturb values 205 representing the cumulative disturb of the associated cells include values representing the disturb before and after updates at times A, B, and C. As shown, the disturb manager 113 can monitor for operations along the media operations control/data path 280, as described above, to determine when to initiate operations on the disturb values stored in the local memory 119 via the local memory operations control/data path 290.

Based on the read operation of the memory cell 250, the disturb manager 113 identifies memory cells 251 and 252 as victims. Such an identification can be based on the address of the aggressor cell. For example, addresses can increment along a bitline before wrapping to the next wordline (e.g., the memory cell 250 is at address '0', the memory cell is at 251 is at address '1', the memory cell 255 is at address '6', etc.). In such a case, the identification of the victims can be based on the address of the aggressor plus or minus '1' (to identify victims along a bitline), and +N+1 and −N−1 where N is the number of memory cells on a bitline (to identify adjacent victims on a wordline). Note that the number of victims is limited for cells that are along the edges or in the corners of the array (e.g., corner aggressors have two victims and edge aggressors have three victims). Based on the identification of the victims, the disturb manager 113 reads the cumulative disturb values associated with victim memory cells 251 and 252 from the local memory 119. In some embodiments, the disturb values 205 can be stored in a portion of the local memory 119 and indexed based on their associated address. Assuming read operations disturb victims by 1, the disturb manager 113 updates the value associated with the memory cell 251 from 36 to 37 and the value associated with the memory cell 252 from 3 to 4 and writes the updated values to their corresponding locations in the local memory 119. The disturb value updates associated with the read operation of the memory cell 250 are shown below the encircled letter A.

Based on the write operation to the memory cell 253, the disturb manager 113 identifies memory cells 251, 254, and 255 as victims, e.g., as described above based on the address associated with the aggressor. Based on the identification of the victims, the disturb manager 113 reads the cumulative disturb values associated with victim memory cells 251, 254, and 255 from the local memory 119. Assuming write operations disturb victims by 10, the disturb manager 113 updates the values associated with the victim memory cells by 10 and writes the updated values to their corresponding locations in the local memory 119. Furthermore, because a write resets the cumulative disturb level associated with the aggressor cell, the disturb manager 113 writes a reset value (in this case, '0') to the disturb value associated with the memory cell 253. The disturb value updates associated with the write operation to the memory cell 253 are shown below the encircled letter B.

Based on the write operation to the memory cell 256, the disturb manager 113 identifies memory cells 255, 257, 258, and 259 as victims, e.g., as described above based on the address associated with the aggressor. Based on the identification of the victims, the disturb manager 113 reads the associated cumulative disturb values, updates them, and writes the updated values to their corresponding locations in the local memory 119. Furthermore, the disturb manager 113 resets the cumulative disturb value associated with the aggressor. The disturb value updates associated with the write operation to the memory cell 256 are shown below the encircled letter C.

In some embodiments, the disturb manager 113 can perform various optimizations to reduce the number of accesses to the local memory 119 because the updates to disturb values 205 need not be synchronous with the corresponding media operations. For example, the disturb manager 113 can maintain a disturb value update queue that includes entries identifying the value being updated and the amount of the update. Prior to adding new entries to the queue, the disturb manager 113 can search the queue for an update to the same location and, if there is a match, adjust the amount of the update by the amount associated with the operation that initiated the new update. With reference to the example in FIG. 2, the disturb manager 113 can update the disturb value associated with the memory cell 255 from 69 to 89 with a single read-update-write cycle rather than with two cycles for the two write operations to memory cells 253 and 256.

Although the above example describes an embodiment in which the disturb manager 113 increments disturb values, in other embodiments, the disturb values can be reset to a large value and decremented until they reach a small value that flags the associated cell(s) for remediation.

Figure 3:
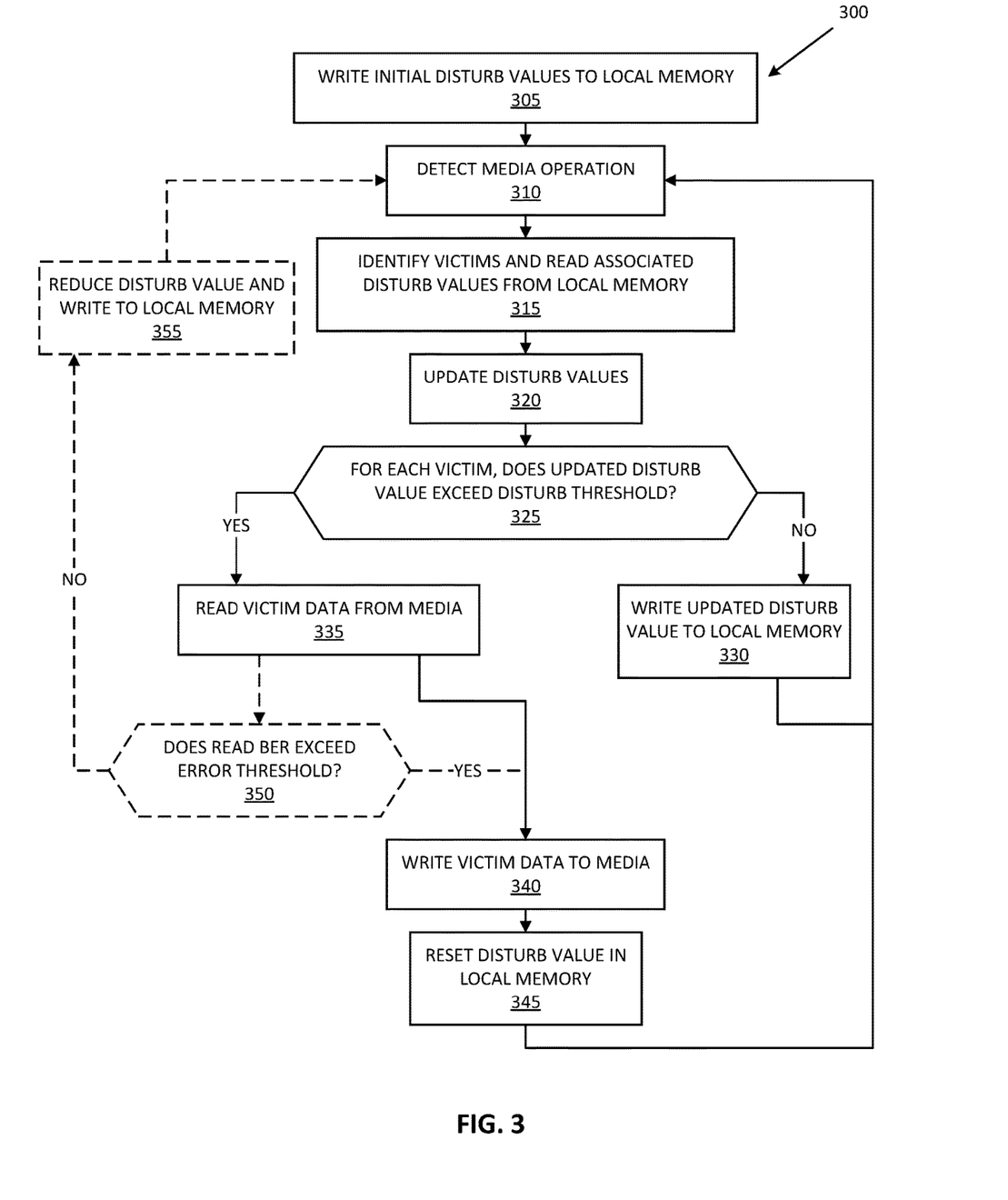
FIG. 3 is a flow diagram of an example method to manage proximity disturb in accordance with some embodiments of the present disclosure.

FIG. 3 is a flow diagram of an example method 300 to manage proximity disturb in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the controller 115. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device writes the initial disturb values to a local memory. As described elsewhere herein, embodiments can track the accumulated disturb associated with a cell or group of cells (e.g., a page, sector, location, or other logical grouping) with a value. The initial disturb values can be initialized or restored from a non-volatile memory at power application, such as was described above with reference to FIG. 1. For example, the controller 115 can read persisted disturb values from the media 112 and write them to the local memory 119 at power on. As another example, the disturb manager 113 can initialize the disturb values using one or more of the above-described techniques, such as random initialization at or near a threshold.

At operation 310, the processing device detects a media operation, such as a read from or a write to a non-volatile memory device. To detect such an operation, for example, the processing device can monitor read or write operations originating either within the processing device (e.g., by another component or process) or from an external device, such as a host computer system. The target (e.g., one or more cells that form a sector) of the operation can be referred to as the aggressor. In another embodiment, the disturb manager 113 is in the media read and write operation path and detects operations by receiving them prior to their execution in the media 112.

At operation 315, the processing device identifies any proximity disturb victims associated with the media operation and reads the disturb values associated with the identified victims from the local memory. The processing device can identify victims and their associated disturb values based on the address of the aggressor, such as was described above with reference to FIGS. 1 and 2.

At operation 320, the processing device updates the disturb values of the victims. The amount of the update can be based on the proximity of the victim to the aggressor, the orientation of the victim to the aggressor, the operation type, and other such factors as described herein. For example, the processing device can update the values associated with immediately adjacent cells to the aggressor along one axis by one amount and the values associated with immediately adjacent cells to the aggressor along different axis by a different amount. Additional details regarding disturb value updates are described above with reference to FIGS. 1 and 2.

At operation 325, the processing device checks whether the updated disturb value exceeds a disturb threshold. Operation 325 is performed for each of the victims (using each updated disturb value associated with a set of one or more cells that are read or written as a group). If the disturb value exceeds the disturb threshold, the method 300 continues to operation 335. Otherwise, the method 300 continues to operation 330. At operation 330, the processing device writes the updated disturb value to the local memory and the method 300 returns to operation 310.

At operation 335, the processing device reads the victim data from the media. In one embodiment, at operation 340, the processing device writes the victim data back to the media. In this manner, the processing device refreshes the data, eliminating an accumulated disturb. Note that operations 335 and 340 can themselves disturb other victims, including the aggressor that triggered the refresh. These additional disturbs are also managed by the method 300 (e.g., detected at operation 310). At operation 345, the processing device resets the disturb value associated with the victim in the local memory (e.g., writes '0' to the memory).

In some embodiments, the processing device can defer performing operation 340 if there is a low risk of data loss. Rather than proceeding from operation 335 to operation 340, the processing device can perform operation 350. At operation 350, the processing device checks whether a BER or other metric relating to the correctness of the data read at operation 335 exceeds an error threshold, such as described above with reference to FIG. 1. For example, if the BER of the read is 1% and the processing devices implements error detection and correction (EDC) that can handle up to a 25% error rate, rewriting the victim data at operation 340 can be deferred. In one embodiment, the processing device checks the BER of the read against an error threshold (e.g., an error threshold of 15% provides a margin with respect to a maximum error rate handled by EDC of 25%). If the BER of the read operation exceeds the error threshold, the method 300 continues to operation 340, described above. If the BER of the read operation does not exceed the error threshold, the method 300 continues to operation 355.

In some embodiments, the processing device reduces the updated disturb value and writes the reduced value to the local memory at operation 355. The reduction can be based on the difference between the BER of the read operation and the error threshold, such as described above with reference to FIG. 1. For example, a read operation (at operation 335) with a high BER relative to the error threshold can have the associated disturb value reduced less than another read operation with a low BER relative to the error threshold.

Figure 4:
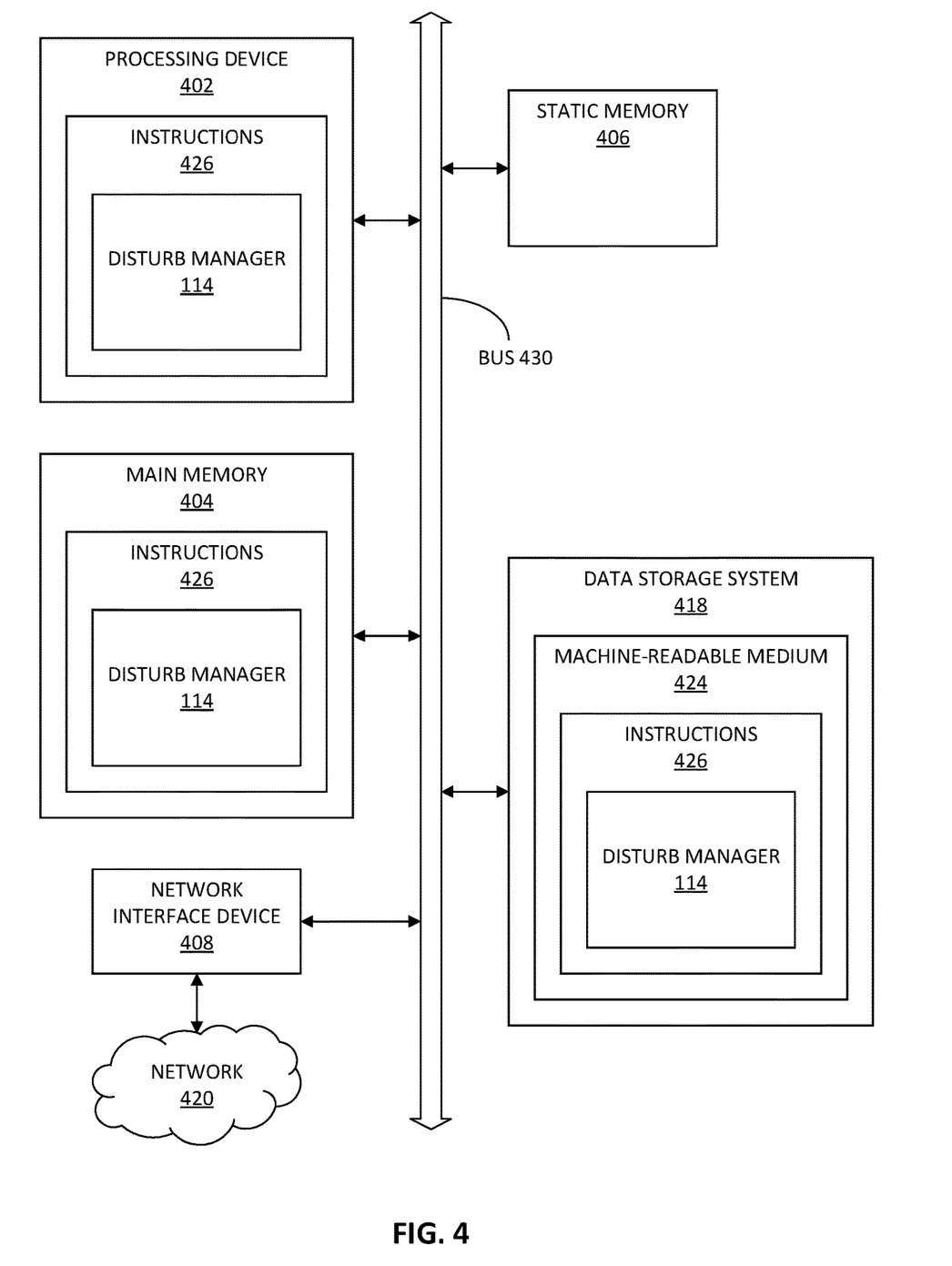
FIG. 4 is a block diagram of an example computer system in which embodiments of the present disclosure can operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the disturb manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Furthermore, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory subsystem 110 of FIG. 1.

In one embodiment, the instructions 426 include instructions to implement functionality corresponding to a disturb manager (e.g., the disturb manager 113 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, can carry out the computer-implemented method 400 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   identifying a first memory location in response to an access of a second memory location, the first memory location storing a first value; and
   updating a first disturb value by a first amount, the first disturb value representing a cumulative disturb effect on the first value in the first memory location by accesses to a first plurality of memory locations proximate to the first memory location, the first plurality of memory locations including the second memory location, and wherein the first amount is based on an orientation of the first memory location relative to the second memory location such that the first amount is one value when the orientation is along one axis and the first amount is a different value when the orientation is along a different axis.

2. The method of claim 1, further comprising:
   in response to a determination that the first disturb value exceeded a threshold:
      reading the first value from the first memory location;
      writing the first value to the first memory location; and
      updating the first disturb value to a reset value.

3. The method of claim 1, further comprising:
   updating, in response to an access to the first memory location, a second disturb value representing a cumulative disturb effect on a second value stored in the second memory location by accesses to a second plurality of memory locations proximate to the second memory location, the second plurality of memory locations including the first memory location.

4. The method of claim 1, further comprising, after an application of power to a memory subsystem, initializing a plurality of disturb values, including the first disturb value, to values within a range of a threshold.

5. The method of claim 1, further comprising, after loss of a primary power source to a memory subsystem, writing a plurality of disturb values, including the first disturb value, to one or more non-volatile memory devices.

6. The method of claim 1, further comprising:
   in response to a determination that the first disturb value exceeded a disturb threshold:
      reading the first value from the first memory location to obtain a bit-error rate (BER); and
      in response to a determination that the BER is below an error threshold, reducing the first disturb value.

7. The method of claim 1, further comprising:
   identifying a third memory location storing a second value affected by an access to the second memory location, wherein the third memory location is adjacent to the second memory location in a first direction and the first memory location is adjacent to the second memory location in a second direction that is different from the first direction; and
   updating a second disturb value by a second amount that is different from the first amount, the second disturb value representing a cumulative effect on the second value in the third memory location by accesses to a second plurality of memory locations proximate to the third memory location, the second plurality of memory locations including the second memory location.

8. A non-transitory computer-readable storage medium comprising instructions that, when executed by a processing device, cause the processing device to:
identify a first memory location in response to an access of a second memory location, the first memory location storing a first value; and
update a first disturb value by a first amount, the first disturb value representing a cumulative disturb effect on the first value in the first memory location by accesses to a first plurality of memory locations proximate to the first memory location, the first plurality of memory locations including the second memory location, and wherein the first amount is based on an orientation of the first memory location relative to the second memory location such that the first amount is one value when the orientation is along one axis and the first amount is a different value when the orientation is along a different axis.

9. The non-transitory computer-readable storage medium of claim 8, wherein the processing device is further to:
in response to a determination that the first disturb value exceeded a threshold:
read the first value from the first memory location;
write the first value to the first memory location; and
update the first disturb value to a reset value.

10. The non-transitory computer-readable storage medium of claim 8, wherein the processing device is further to update, in response to an access to the first memory location, a second disturb value representing a cumulative disturb effect on a second value stored in the second memory location by accesses to a second plurality of memory locations proximate to the second memory location, the second plurality of memory locations including the first memory location.

11. The non-transitory computer-readable storage medium of claim 8, wherein the processing device is further to, after an application of power to a memory subsystem, initialize a plurality of disturb values, including the first disturb value, to values within a range of a threshold.

12. The non-transitory computer-readable storage medium of claim 8, wherein the processing device is further to, after loss of a primary power source to a memory subsystem, write a plurality of disturb values, including the first disturb value, to one or more non-volatile memory devices.

13. The non-transitory computer-readable storage medium of claim 8, wherein, in response to a determination that the first disturb value exceeded a disturb threshold, the processing device is further to:
read the first value from the first memory location to obtain a bit-error rate (BER); and
in response to a determination that the BER is below an error threshold, reduce the first disturb value.

14. The non-transitory computer-readable storage medium of claim 8, wherein the processing device is further to:
identify a third memory location storing a second value affected by an access to the second memory location, wherein the third memory location is adjacent to the second memory location in a first direction and the first memory location is adjacent to the second memory location in a second direction that is different from the first direction; and
update a second disturb value by a second amount that is different from the first amount, the second disturb value representing a cumulative effect on the second value in the third memory location by accesses to a second plurality of memory locations proximate to the third memory location, the second plurality of memory locations including the second memory location.

15. A system comprising:
a non-volatile memory component that includes a first memory location and a second memory location; and
a processing device, operatively coupled with the non-volatile memory component, to:
identify the first memory location in response to an access of the second memory location, the first memory location storing a first value; and
update a first disturb value by a first amount, the first disturb value representing a cumulative disturb effect on the first value in the first memory location by accesses to a first plurality of memory locations proximate to the first memory location, the first plurality of memory locations including the second memory location, and wherein the first amount is based on an orientation of the first memory location relative to the second memory location such that the first amount is one value when the orientation is along one axis and the first amount is a different value when the orientation is along a different axis.

16. The system of claim 15, wherein the processing device is further to:
in response to a determination that the first disturb value exceeded a threshold:
read the first value from the first memory location;
write the first value to the first memory location; and
update the first disturb value to a reset value.

17. The system of claim 15, wherein the processing device is further to update, in response to an access to the first memory location, a second disturb value representing a cumulative disturb effect on a second value stored in the second memory location by accesses to a second plurality of memory locations proximate to the second memory location, the second plurality of memory locations including the first memory location.

18. The system of claim 15, wherein the processing device is further to, after an application of power to a memory subsystem, initialize a plurality of disturb values, including the first disturb value, to values within a range of a threshold.

19. The system of claim 15, wherein the processing device is further to, after loss of a primary power source to a memory subsystem, write a plurality of disturb values, including the first disturb value, to the non-volatile memory component.

20. The system of claim 15, wherein the processing device is further to:
identify a third memory location storing a second value affected by an access to the second memory location, wherein the third memory location is adjacent to the second memory location in a first direction and the first memory location is adjacent to the second memory location in a second direction that is different from the first direction; and
update a second disturb value by a second amount that is different from the first amount, the second disturb value representing a cumulative effect on the second value in the third memory location by accesses to a second plurality of memory locations proximate to the third memory location, the second plurality of memory locations including the second memory location.

* * * * *